United States Patent
Sugawara (10) Patent No.: US 6,933,737 B2
(45) Date of Patent: Aug. 23, 2005

(54) PROBE CARD

(75) Inventor: Shinichi Sugawara, Miyagi (JP)

(73) Assignee: Iwasaki Correspond Industry Co., Ltd., Miyagi (JP)

( * ) Notice: Subject to any disclaimer, the term of this patent is extended or adjusted under 35 U.S.C. 154(b) by 0 days.

(21) Appl. No.: 10/663,376

(22) Filed: Sep. 15, 2003

(65) Prior Publication Data

US 2004/0124862 A1 Jul. 1, 2004

(51) Int. Cl.[7] .................. G01R 31/02; G01R 1/06
(52) U.S. Cl. ........................ 324/754; 324/755
(58) Field of Search ................. 324/750–765

(56) References Cited

U.S. PATENT DOCUMENTS

| | | | | |
|---|---|---|---|---|
| 4,554,506 A | * | 11/1985 | Faure et al. | 324/761 |
| 4,901,013 A | * | 2/1990 | Benedetto et al. | 324/761 |
| 4,963,822 A | * | 10/1990 | Prokopp | 324/758 |
| 6,144,212 A | * | 11/2000 | Mizuta | 324/754 |
| 6,426,637 B1 | * | 7/2002 | Dang et al. | 324/754 |
| 2001/0028255 A1 | | 10/2001 | Endo | 324/761 |

* cited by examiner

*Primary Examiner*—Vinh Nguyen
*Assistant Examiner*—Emily Y Chan
(74) *Attorney, Agent, or Firm*—Dellett & Walters (57) ABSTRACT

In the probe card of the semiconductor device measurement device, measurement is to be done in the stability without damage beyond the needle diameter on the pad of the wafer by the probe needle. The straight probe needle 5 is inserted in the upper guide plate 2, the rotary guide plate 3 and the bottom guide plate 4. The rotary guide plate 3 is a little displaced, and the center of the probe needle 5 is bent. Under this condition, the stage with the wafer thereon is raised, and then the tip of the probe needle 5 reaches the pad on the surface of the wafer. The rotary guide plate 3 has a guide slot 7. The rotary guide plate 3 is moved in the horizontal plane. The fixed guide pin 8 moves along the guide slot 7. The probe needle 5 rotates like swinging. The probe needle 5 breaks through the natural oxide film stuck on the pad. In this way, the dispersion of the pressure of the probe needle 5 is prevented. Measurement can be done without damage beyond the needle diameter on the pad of the wafer. Moreover, the pitch of the probe needle 5 can be narrow, and assembling becomes easy.

4 Claims, 11 Drawing Sheets

PROBE CARD

BACKGROUND OF THE INVENTION

1. Field of the Invention

This invention relates to a probe card, especially to a probe card to connect electrically between semiconductor measuring apparatus and IC pads.

2. Description of the Prior Art

In the manufacturing process of semiconductor integrated circuit, after the end of diffusion process, by semiconductor measuring apparatus (tester), the electrical characteristics are measured in the state of wafer. In this tester, as a board to connect electrically IC pads (electrodes) with the tester itself, a probe card is provided. The probe needles furnished in this probe card are contacted to IC pads in order to connect to IC electrically.

The conventional probe card is comprised of printed circuit board, probe needles, resin to fix needles, upper guide plate, lower guide plate and fixing frame. A print circuit board connects probe needle to the measurement device itself electrically. The top end of probe needle is connected to wirings on the print circuit board with soldering. The lower end of the probe needle is the tip to touch a pad. At the center of probe needle, there is a curving part to buffer contact pressure toward the pad. Resin to fix needles fixes probe needle under the print circuit board. The upper and lower guide plates guide probe needles by guide holes to pass through probe needles. The fixing frame is fixed to the print circuit board and fixes the needle-fixing resin and the upper and lower guide plates parallel to the print circuit board.

When the wafer is measured, moving the wafer stage within its plane, after the position and the direction are fitted, the stage is lifted to contact the tip of the probe needle to the pad on the surface of the wafer. But the electrical resistance of the contact is large because natural oxide film sticks to the surface of the pad as the wafer is exposed in the atmosphere. It is necessary to expose the metallic surface of the pad in order to connect the probe needle electrically to the pad breaking through the natural oxide film by the probe needle. Therefore, after contacting the pad with probe needle once by raising the stage, furthermore, the stage is raised again. In this way, electrical contact is satisfied because the oxide film on the surface of the pad is scraped by probe needle.

By the way, there are two types of probe card. The probe card of the first type is of the cantilever type, wherein the probe needle comes out of the baseboard in the side oblique direction. The probe card of the second type is of the vertical needle type, wherein the probe needle comes out of the baseboard in the vertical direction. In the case of the cantilever type, probe needle can scrape an oxide film easily sliding on the pad according to the rise of the stage because the probe needle comes out of the board obliquely. In the case of the vertical needle type, contact defect is often caused because the oxide film stuck to the surface of the pad cannot be removed. The probe needle hardly slides on the pad as the probe needle contacts vertically to the pad. In order to solve this problem, in "Semiconductor device measurement device" disclosed in the U.S. patent application 2001-0028255, the oxide film stuck to the surface of the pad is removed by turning probe needles.

Figure 9A:
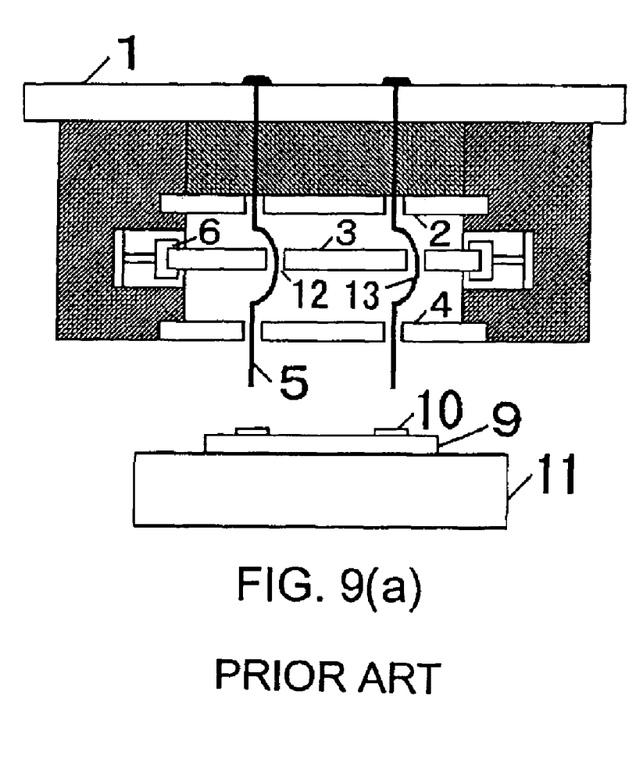
FIGS. 9(a) and 9(b) are the side view of the probe card of the prior semiconductor device measurement device.
Figure 9B:
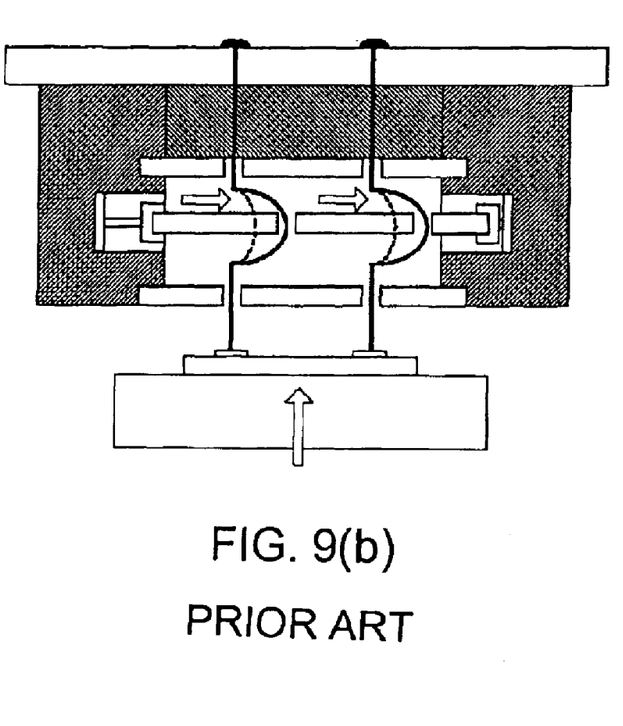

As shown in FIG. 9, in this semiconductor measuring apparatus, the rotating guide plate 3 of insulator is arranged between the upper guide plate 2 and the lower guide plate 4. The driving device 6 moves the rotating guide plate 3. The curving part 13 of each probe needle 5 is rotated to the fixed direction through the guide hole 12 of the rotating guide plate 3. As shown in FIG. 9(a), the driving device 6 holds the both ends of the rotating guide plate 3 by the arm. When to drive, as shown in FIG. 9(b), receiving electric signal, the driving device 6 moves the rotating guide plate 3 as the guide hole 12 revolves around the axis of the probe needle 5. In this way, the curving part 13 of the probe needle 5 inserted in the guide hole 12 of the rotating guide plate 3 is forced to revolve centering the axis of the probe needle 5. As the result, the lower top of the needle rotates on the pad 10 and contacts to the pad 10 breaking through the natural oxide film stuck on the surface of the pad.

However, in the conventional probe card, there is a problem that the pad and vamp are unnecessarily damaged. Dispersions of height and position surely exist in probe needle. Dispersions of the form and the movement are easily caused because the probe needle is processed to be a spring. Therefore, some probe needle applies unnecessarily strong force to the pad, some probe needle applies only minimum necessary force to the pad. The strong probe needle injures the pad with the strong force. And also there is a problem that assembling is difficult in the case of the probe needle being rotated with the curving part in the center. The pitch of the probe needles is restricted by the size of the curving part. Such probe card cannot be applied to the narrow pitch pad.

The object of the present invention is to enable the measurement of integrated circuit without damage larger than the needle diameter on the pad by contacting the probe needle to the pad of wafer with the uniform needle pressure in the probe card of semiconductor measuring apparatus by solving the above-mentioned problems of the last.

To solve the above-mentioned problem, in the present invention, the probe card is comprised as follows: an electrically-conductive linear probe needle whose bottom end contacts with the device under test, a circuit board with which the upper end of the probe needle is connected electrically, an upper guide plate held horizontally and firmly near the middle point between the upper end and the center of said probe needle and having a guide hole to guide said probe needle, a lower guide plate held horizontally and firmly near the middle point between the center and the bottom end of said prove needle and having a guide hole to guide said probe needle, a rotary guide plate held horizontally and movably near the center of said probe needle and having a guide hole to guide said probe needle, an initial-position holding means to hold said rotary guide plate temporary and firmly at the initial position where said probe needle is straight, a movable holding means to hold movably said rotary guide plate at the position where the center of said probe needle bent, a driving means to move said rotary guide plate in the horizontal plane.

Measurement can be done without damage larger than the needle diameter on the pad of wafer by preventing the dispersion of the pressure of probe needle. The probe card can be applied to the integrated circuit of narrow pitch pad as the probe needle is straight. Assembling of the probe card becomes easy.

SUMMARY OF THE INVENTION

In the probe card of the semiconductor device measurement device, measurement is to be done in the stability without damage beyond the needle diameter on the pad of the wafer by the probe needle. The straight probe needle 5 is inserted in the upper guide plate 2, the rotary guide plate 3 and the bottom guide plate 4. The rotary guide plate 3 is a little displaced, and the center of the probe needle 5 is bent. Under this condition, the stage with the wafer thereon is raised, and then the tip of the probe needle 5 reaches the pad on the surface of the wafer. The rotary guide plate 3 has a guide slot 7. The rotary guide plate 3 is moved in the horizontal plane. The fixed guide pin 8 moves along the guide slot 7. The probe needle 5 rotates like swinging. The probe needle 5 breaks through the natural oxide film stuck on the pad. In this way, the dispersion of the pressure of the probe needle 5 is prevented. Measurement can be done without damage beyond the needle diameter on the pad of the wafer. Moreover, the pitch of the probe needle 5 can be narrow, and assembling becomes easy. The probe card of this invention is the most suitable as a probe card to make the electric connection with the pad of the semiconductor device measurement device itself and the IC. The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DETAILED DESCRIPTION OF THE INVENTION

Hereinafter, the most preferable embodiments of the present invention are explained in detail referring to FIGS. 1–8.

The first embodiment of the present invention is the probe card, wherein the straight probe needle is inserted through the upper guide plate, the rotary guide plate and the lower guide plate, the center of probe needle is bent by moving the rotary guide plate in the horizontal direction and the probe needle is rotated by moving the circular arc part of the guide slot of the rotary guide plate along the fixed guide pin.

Figure 1:
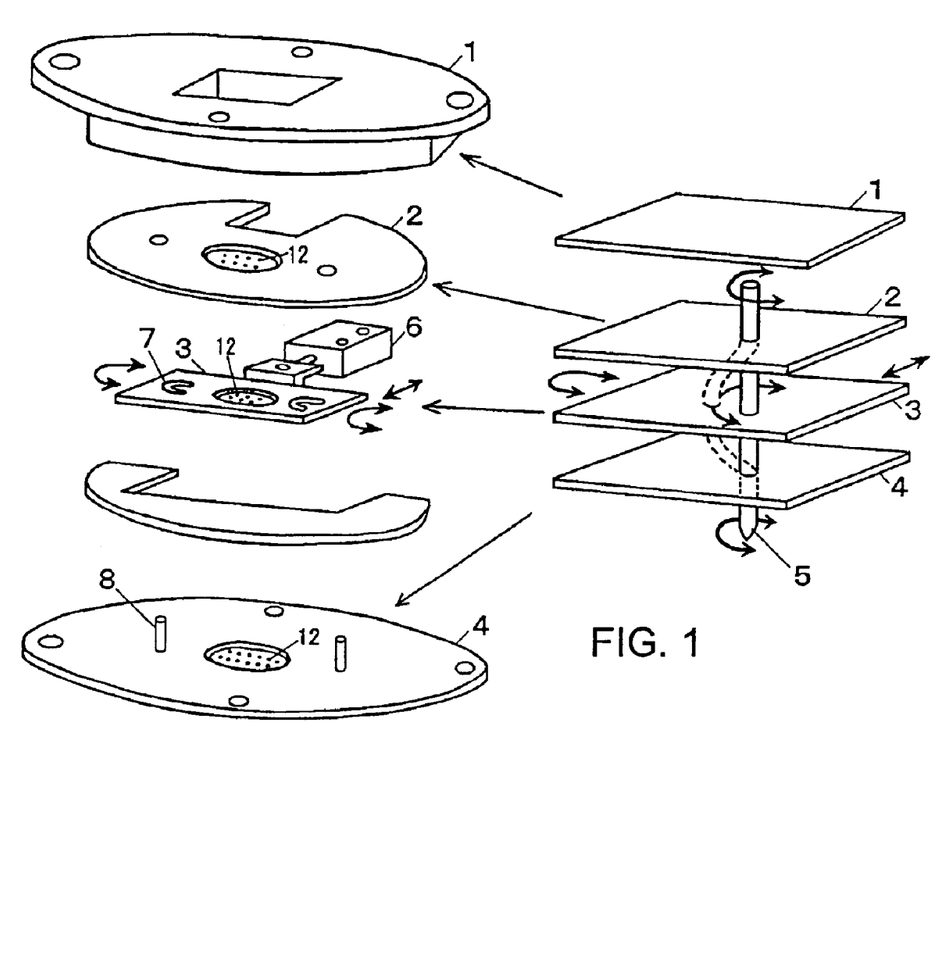
FIG. 1 is the disassembled oblique view of probe card of the first embodiment of this invention.

FIG. 1 is the disassembled oblique view of probe card of the first embodiment of this invention. In FIG. 1, the wiring circuit board 1 is the means to connect probe needle to the measurement device electrically. The upper guide plate 2 is the upside plate to guide the probe needle by the guide hole to pass through probe needle. The rotary guide plate 3 is the plate to rotate probe needle. The lower guide plate 4 is the lower-side plate to guide probe needle by guide hole to pass through probe needle. Probe needle 5 is the needle to conduct the electric signal by touching the pad on the wafer. The driving device 6 is the electromagnetic plunger or the motor to push the rotary guide plate. The guide slot 7 is the slot to guide the rotary guide plate. The fixed guide pin 8 is the pin to guide the rotary guide plate to move along the guide slot. Guide hole 12 is the hole to pass through probe needle.

Figure 2:
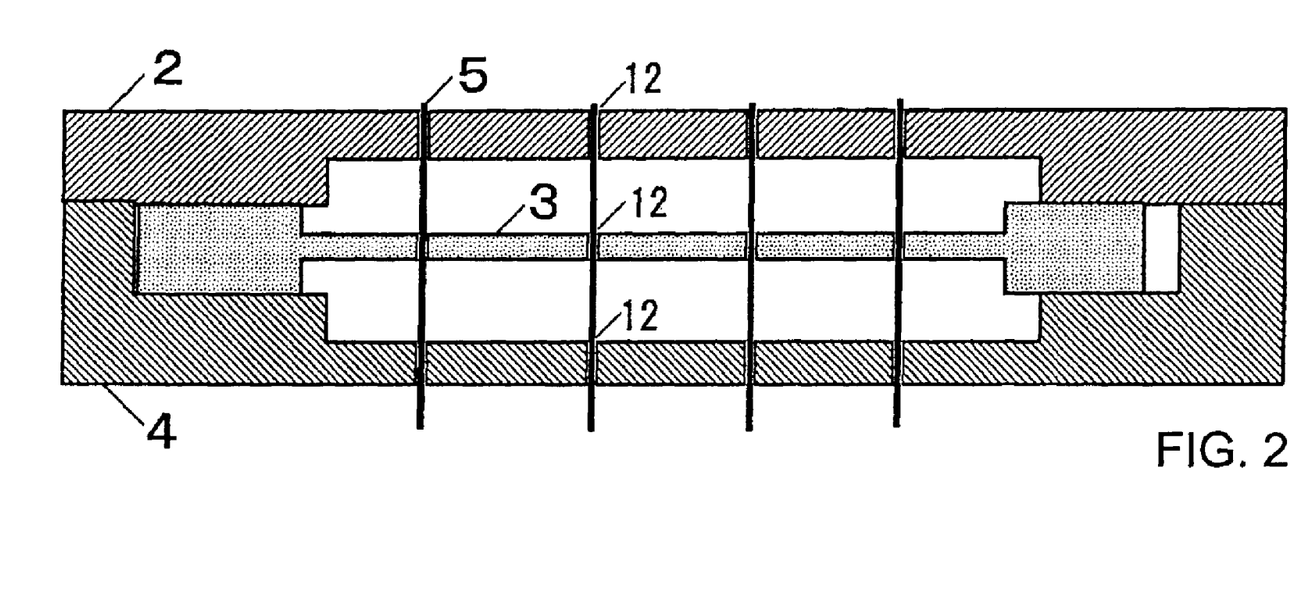
FIG. 2 is the side view of the initial condition of probe card of the first embodiment of this invention.
Figure 3:
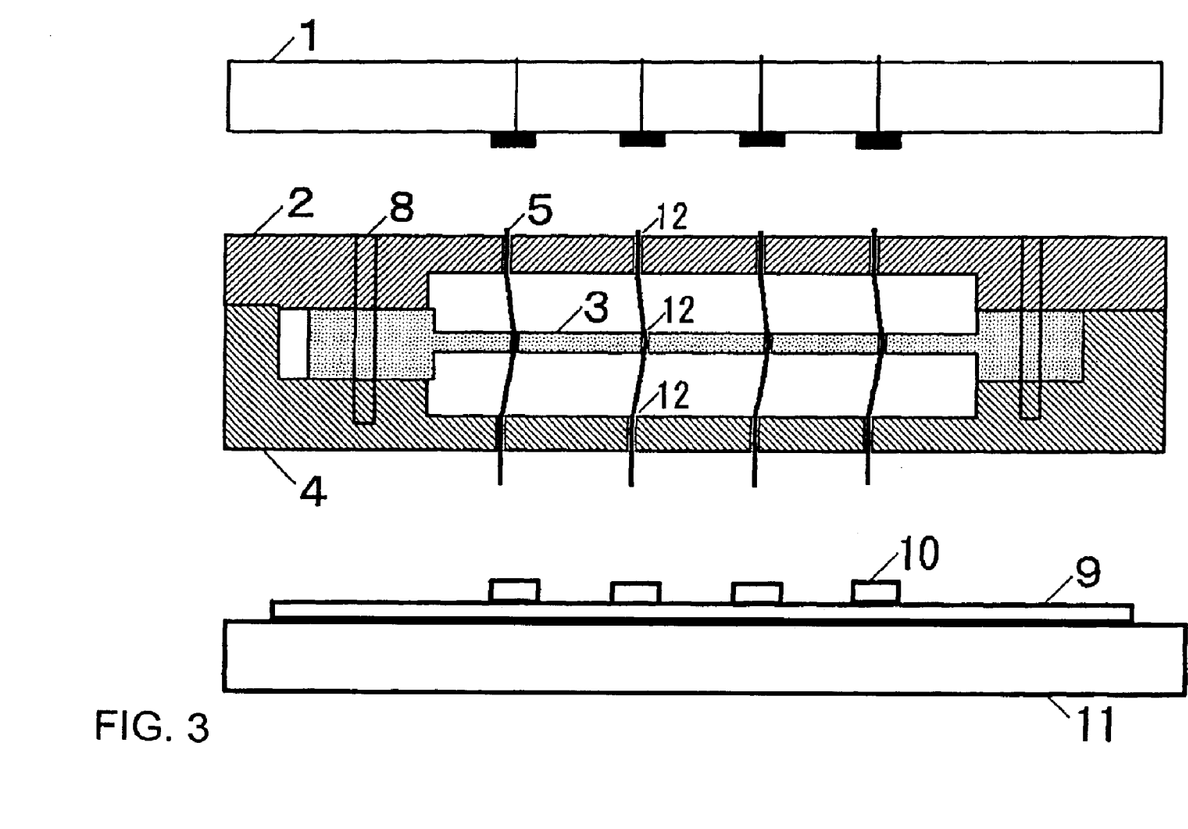
FIG. 3 is the side view of the drive condition of probe card.
Figure 4A:
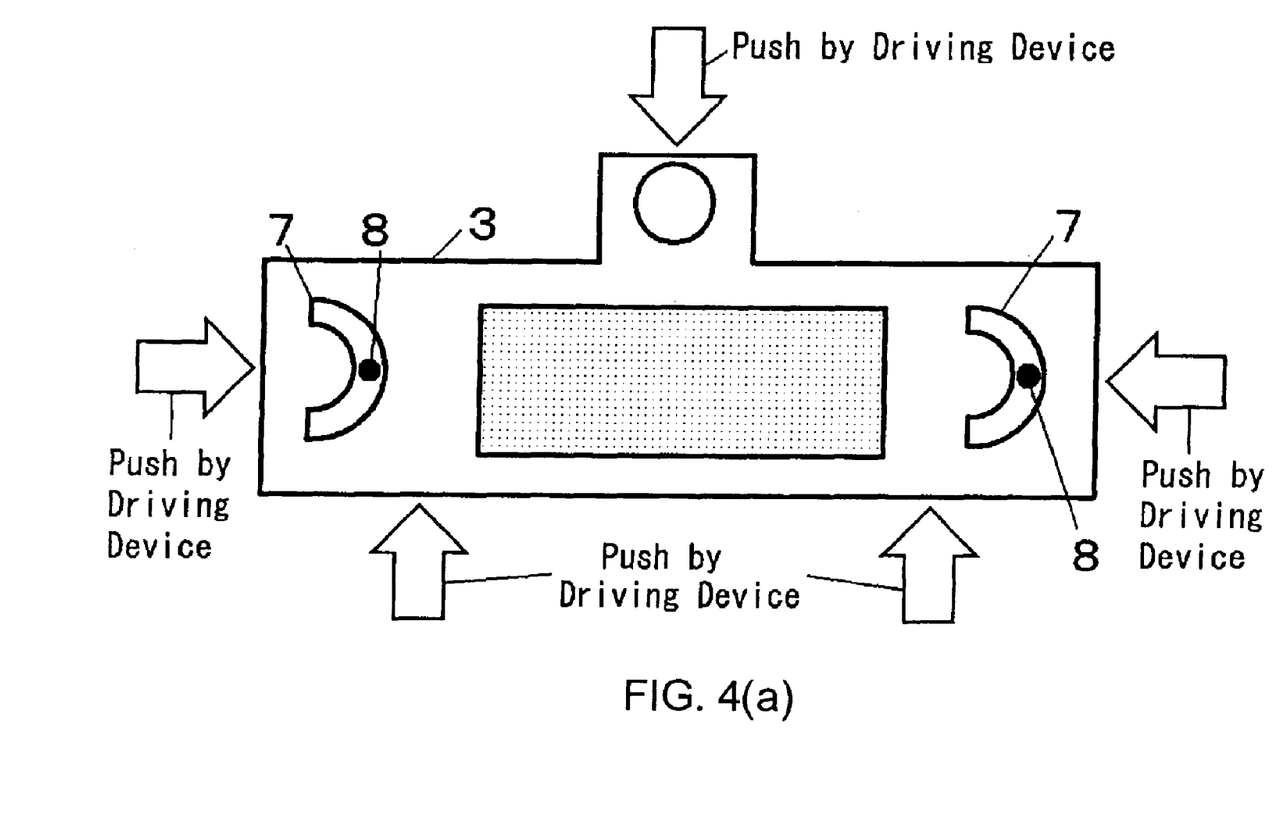
FIGS. 4(a), 4(b) and 4(c) comprise the plan view of the rotary guide plate of the probe card and the illustrative figure of rotation.
Figure 4B:
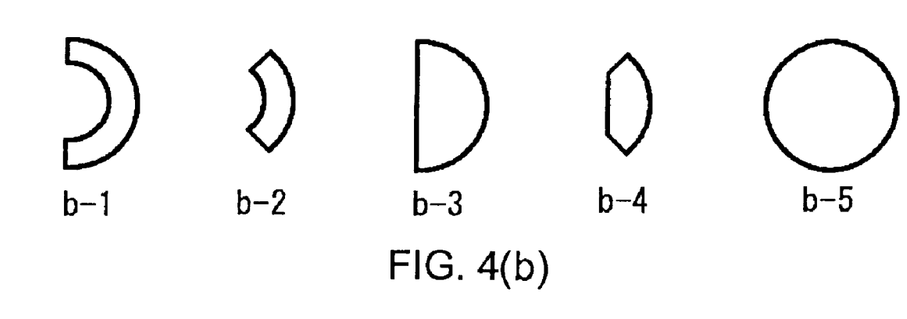
Figure 4C:
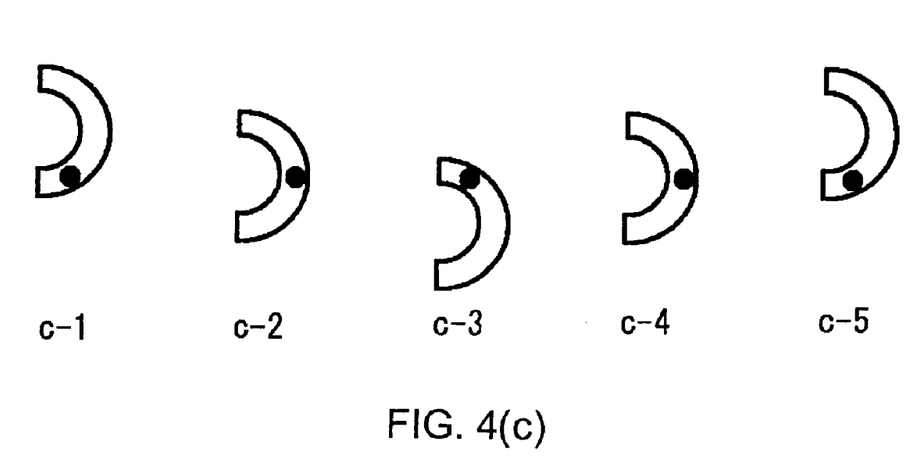
Figure 5:
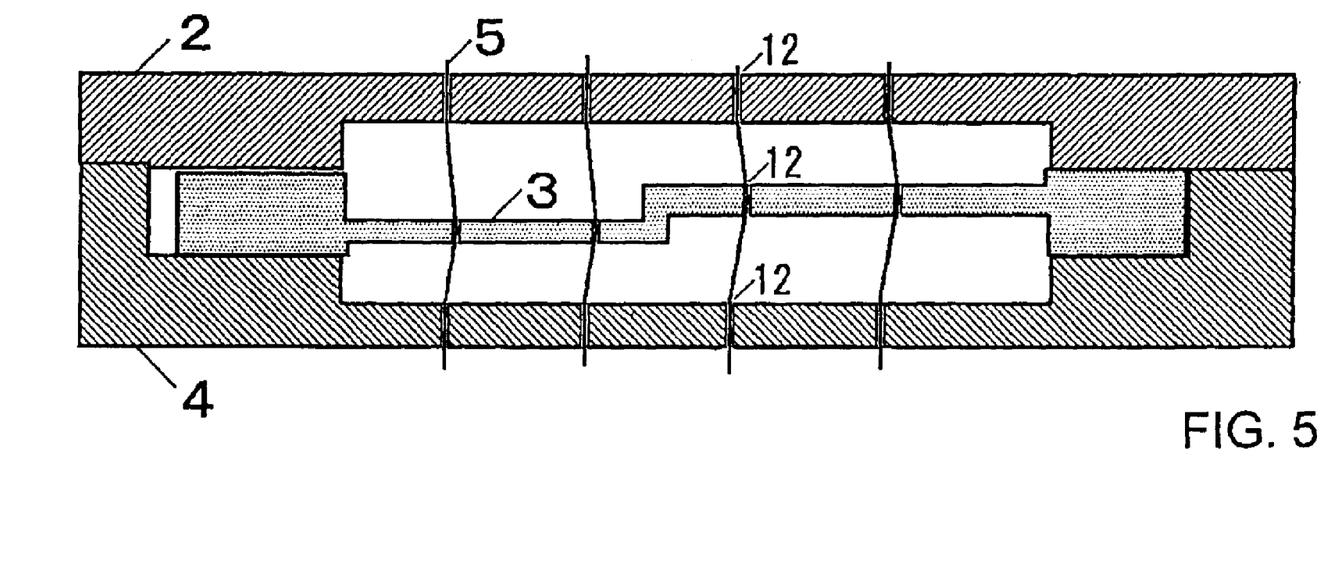
FIG. 5 is the side view of the probe card with the stepped-stage in working.

FIG. 2 is the side view of the initial condition of the probe card of the first embodiment of this invention. FIG. 3 is the side view of the drive condition of the probe card. In FIG. 3, wafer 9 is the semiconductor circuit board that the integrated circuit is formed. The pad 10 is the terminal for the connection of the signal and the power supply. The stage 11 is the base to raise and lower wafer put thereon. FIG. 4 is the plan view of the rotary guide plate of the probe card and the illustrative figure of rotation. FIG. 5 is the side view of the probe card with stepped-stage in working.

The working of the probe card in the first embodiment of this invention as composed above is explained. First, the functional outline of the probe card is explained with referring to FIG. 1. The upper guide plate 2 having guide hole 12 to guide the probe needle 5 is held horizontally fixedly between the top and the center of the probe needle 5. The rotary guide plate 3 having the guide hole 12 to guide the probe needle 5 is held enabling to move horizontally in the center of the probe needle 5. The rotary guide plate 3 is held fixed temporarily in the initial position where the probe needle 5 becomes straight by the initial position holding means. The lower guide plate 4 having the guide hole 12 to guide the probe needle 5 is held fixed horizontally between the center and the bottom of the probe needle 5. The probe needle 5 is connected to the wiring circuit board 1 electrically by contacting the top end of the probe needle to the board. The fixed guide pin 8 is inserted into the guide slot 7 in the rotary guide plate 3 and the rotary guide plate 3 is held enabling to move in the position where the center of the probe needle 5 becomes bent. The tip of the conductive straight probe needle 5 is moved to contact with the device under test. The driving device 6 moves the rotary guide plate 3 in the horizontal plane. The probe needle 5 may be rotated when the measurement starts, or may be rotated after every constant period. Or, it may be rotated automatically at any time corresponding to the measurement condition.

The initial condition of the probe card is explained with referring to the FIG. 2. The upper guide plate 2, the rotary guide plate 3 and the bottom guide plate 4 are assembled so that the guide holes 12 to pass through the probe needle 5 are aligned in a line. The rotary guide plate 3 is fixed temporarily by the initial position holding means. In this condition, the straight probe needle 5 is passed through the guide hole 12. The side view of this condition is FIG. 2.

The drive condition of the probe card is explained with referring to the FIG. 3. The fixation by the initial position holding means is canceled, and the rotary guide plate 3 is a little moved horizontally, and the probe needle 5 is made to bend. The fixed guide pin 8 is inserted into the guide slot 7 of the rotary guide plate 3 under this condition. The side view of this condition is shown in FIG. 3.

The method to rotate the probe needle 5 with the rotary guide plate 3 is explained with referring to FIG. 4. The driving device 6 pushes the rotary guide plate 3 in the bottom direction of FIG. 4(a). Then the rotary guide plate 3 moves in the bottom direction of FIG. 4(a) as the arc part of the guide slot 7 is moving along the fixed guide pin 8. The driving device 6 is a means to generate the driving force by electromagnetic plunger or the motor. The driving device 6 may be another driving force generating means such as an air-cylinder or so. The arc part of the guide slot 7 moves along the fixed guide pin 8. Then the rotary guide plate 3 moves as parallel sliding in its plane along the arc. The probe needle 5 rotates ⅓–¼ turn. The central angle of the arc part of the guide slot 7 shown in FIG. 4(a) is about 180 degrees. Then the rotary guide plate 3 is restricted to rotate 180 degrees. The rotary guide plate 3 can rotate 180–360 degrees if the form of the guide slot 7 and the driving force of the driving device 6 are chosen corresponding to the purpose.

FIG. 4(a) shows the condition that the rotary guide plate 3 is in the middle position. The form of the guide slot 7 is a partial arc. Its central angle is chosen corresponding to the character and the number etc of the probe needle 5. As shown in FIG. 4(b), the shape of the slot edge that the fixed guide pin 8 slides along should be arc. But the form of other part of the guide slot 7 may be any form with enough room for the fixed guide pin 8 to pass through. The form may be the half-disc, the sector or the full disc etc, not restricted to be crescent. The rotary angle of the probe needle 5 can be 360 degrees by setting up the form of the guide slot 7 and the driving device 6 suitably. The probe needle 5 can be rotated more than 360 degrees if the form of the guide slot 7 is a full disc. The rotation angle of the probe needle 5 can be set up freely corresponding to the purpose. At least two guide slots 7 are necessary. More than three guide slots 7 can be set up to enhance the precision of the movement. The rotary guide plate 3 might not move smoothly in some case of special shape of the guide slot 7. The force may be applied to the right or both sides of the rotary guide plate 3 to press in the central direction. The guide slot 7 may be composed of plastics with a little frictional coefficient or the solid lubricant. But, electrically conductive solid lubricant such as graphite is not suitable to use.

As shown in FIG. 4(c), the probe needle 5 is rotated partially like a swing when the right-side arc of the guide slot 7 is moved along the fixed guide pin 8 by pushing the rotary guide plate 3 with the driving device 6. FIG. 4(c) c-1 shows the state that the combined force of each driving force of the driving device 6 is applied to the rotary guide plate 3 from the bottom of the figure. It is the state that the rotary guide plate 3 is moved most in the upward side of the figure. FIG. 4(c) c-2 shows the state that the driving force of the driving device 6 is applied to the rotary guide plate 3 from the top and right of the figure. It is the state that the rotary guide plate 3 is moved in the downward side of the figure. The probe needle 5 is rotated about 60 degrees. FIG. 4(c) c-3 shows the state that the driving force of the driving device 6 is applied to the rotation guide plate 3 from the top of the figure. It is the state that the rotary guide plate 3 is moved most in the downward side of the figure. The probe needle 5 is rotated about 120 degrees. FIG. 4(c) c-4 shows the state that the driving force of the driving device 6 is applied to the rotary guide plate 3 from the top and right of the figure. It is the state that the rotary guide plate 3 returns half in the upward side of the figure. FIG. 4(c) c-5 shows the state that the driving force of the driving device 6 is applied to the rotary guide plate 3 from the bottom of the figure. It is the state that the rotary guide plate 3 returns most in the upward side of the figure. One cycle of the swing rotation of the probe needle 5 is completed in this way. This cycle is repeated as much as necessary.

In this probe card, the swing rotation can be repeated any necessary times with the probe needle 5 on the pad 10 of the wafer 9. The stage 11 is raised and then the probe needle 5 reaches the pad 10 of the wafer 9. After every probe needles 5 contacts all to the pad 10, the driving device 6 begins to rotate the probe needles 5. The probe needle 5 is not rotated even if the probe needle 5 reaches the pad 10 while the wafer 9 is rising.

The rotary guide plate 3 bends the straight probe needle 5 only a little. Therefore, the interval of the probe needles can be made small comparing to the case that the center of the probe needle 5 is curved. The diameter of the probe needle 5 is about 50~100 microns. The pitch of the needles is more than about 80 microns. The bend of the probe needle 5 is about 0.5 mm. These numerical values are the examples of the typical value. Even other numerical values except for these values can be applied to the embodiments.

As for processing of the probe needle 5, the needlepoint is trimmed and the length is managed strictly. No extra processing such as to form a curving part is not performed. Therefore, the dispersion of the form and the elasticity of the probe needle 5 can be restrained, and the needle pressure can be uniform. The probe needle 5 reaches perpendicular the pad 10 or the vamp and it only rotates like swinging quickly. Because the probe needle 5 does not scribe the pad 10, even if the pad 10 is damaged, the size of the scratch is less than the diameter of the needle. Comparing to scribing, the oxide trash hardly sticks to the needlepoint. The probe needle 5 is made of tungsten typically. Other metals of the quality are available. The shape of the needlepoint may be conic. The needlepoint of the triangular or square pyramid can break through the oxide film effectively. The oxides on the surface of the pad 10 are $Al_2O_3$ or $SiO_2$ typically. The oxide of the organic solvent accumulates on the surface of the pad 10 and becomes an insulator layer as well. This insulator layer can be broken through in the same way.

As shown in FIG. 5, the rotary guide plate 3 has a stepped-stage. The shape of the rotary guide plate 3 is made to be the skip-floor form. Even if the needle diameter of the probe needle 5 is different, it is possible to adjust the needle pressure uniform. When the probe needle 5 is bent with the rotary guide plate 3 dislocated, even if the bend of the probe needle 5 is the same, the elasticity coefficient (spring constant) of the probe needle 5 becomes different because the deflection angle of the probe needle 5 is different according to the height of the rotary guide plate 3. The elasticity coefficient of the thick probe needle is large basically. The needle pressure of the thick probe needle can be adjusted to become the same as of the thin probe needle by bending the thick probe needle so that the elasticity coefficient may become relatively small. And also it is possible that the needle pressure of the different diameter needle is made the same as the needle pressure of other probe needles by shifting the position of the guide hole of the rotary guide plate 3 to pass through the probe needle 5. In this case, assembling becomes a little difficult because the probe needle 5 is bent in the state shown in FIG. 2.

As explained above, in the first embodiment of the present invention, the probe card is comprised as follows. The straight probe needle is inserted through the upper guide plate, the rotary guide plate and the lower guide plate, the center of probe needle is bent by moving the rotary guide plate in the horizontal direction and the probe needle is rotated by moving the circular arc part of the guide slot of the rotary guide plate along the fixed guide pin. Therefore, the needle pressure becomes uniform. The scratch by the probe needle is smaller than the needle diameter. The measurement can be done without damaging the pad of the wafer. The pad is not damaged unnecessarily because no scribing damages the pad and no scratch beyond the needle diameter damages the pad.

The second embodiment of the present invention is the probe card, wherein the straight probe needle is inserted through the upper guide plate, the rotary guide plate and the lower guide plate, the center of probe needle is bent by displacing the rotating guide plate in the horizontal direction and the probe needle is rotated by rotating the rotary guide plate around the fixed guide pin inserted in the eccentric bearing in the rotary guide plate.

Figure 6A:
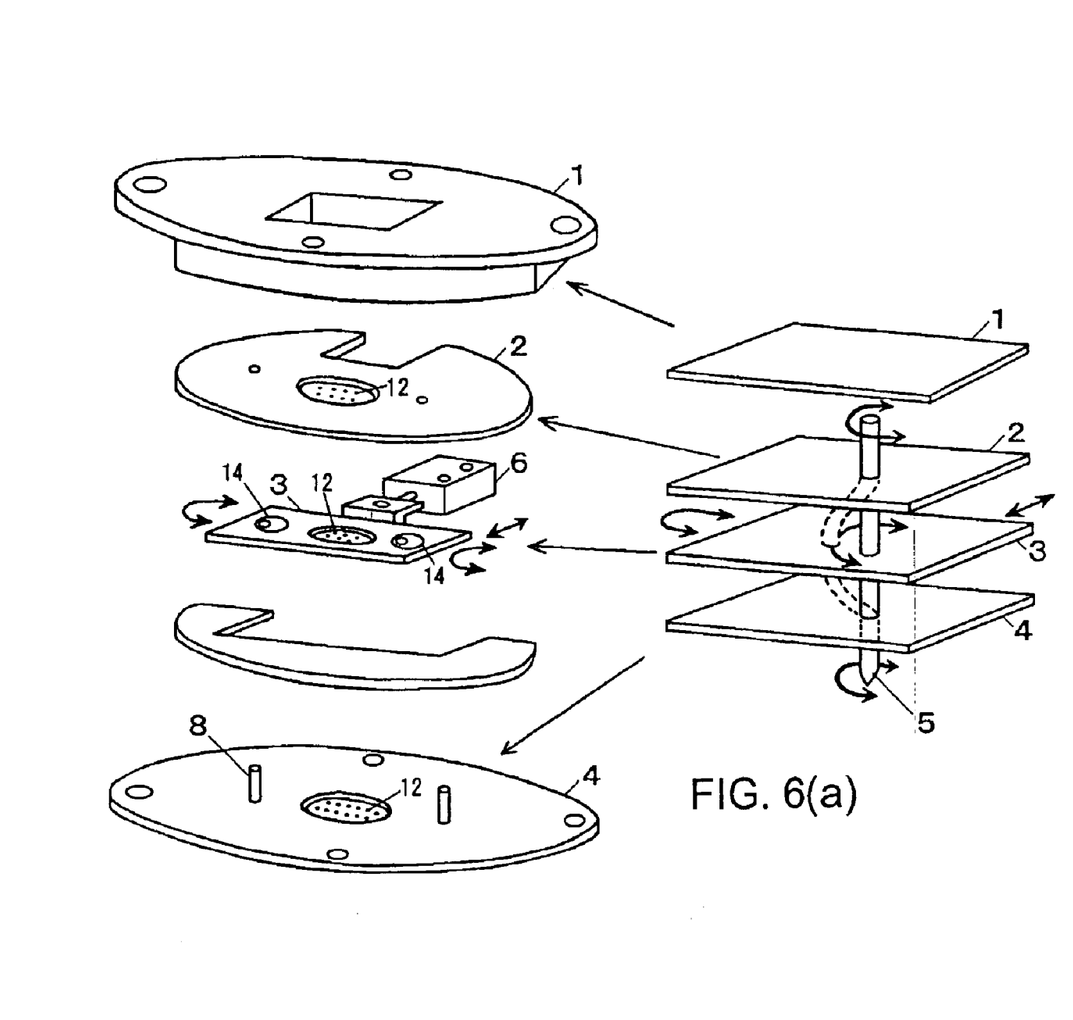
FIG. 6(a) is the disassembled oblique view of probe card of the second embodiment of this invention.
Figure 6B:
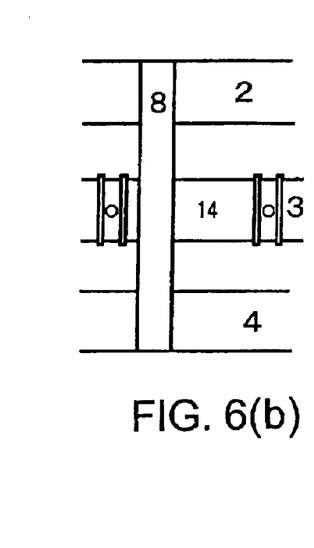
FIG. 6(b) is the cross section of eccentric bearing.
Figure 7A:
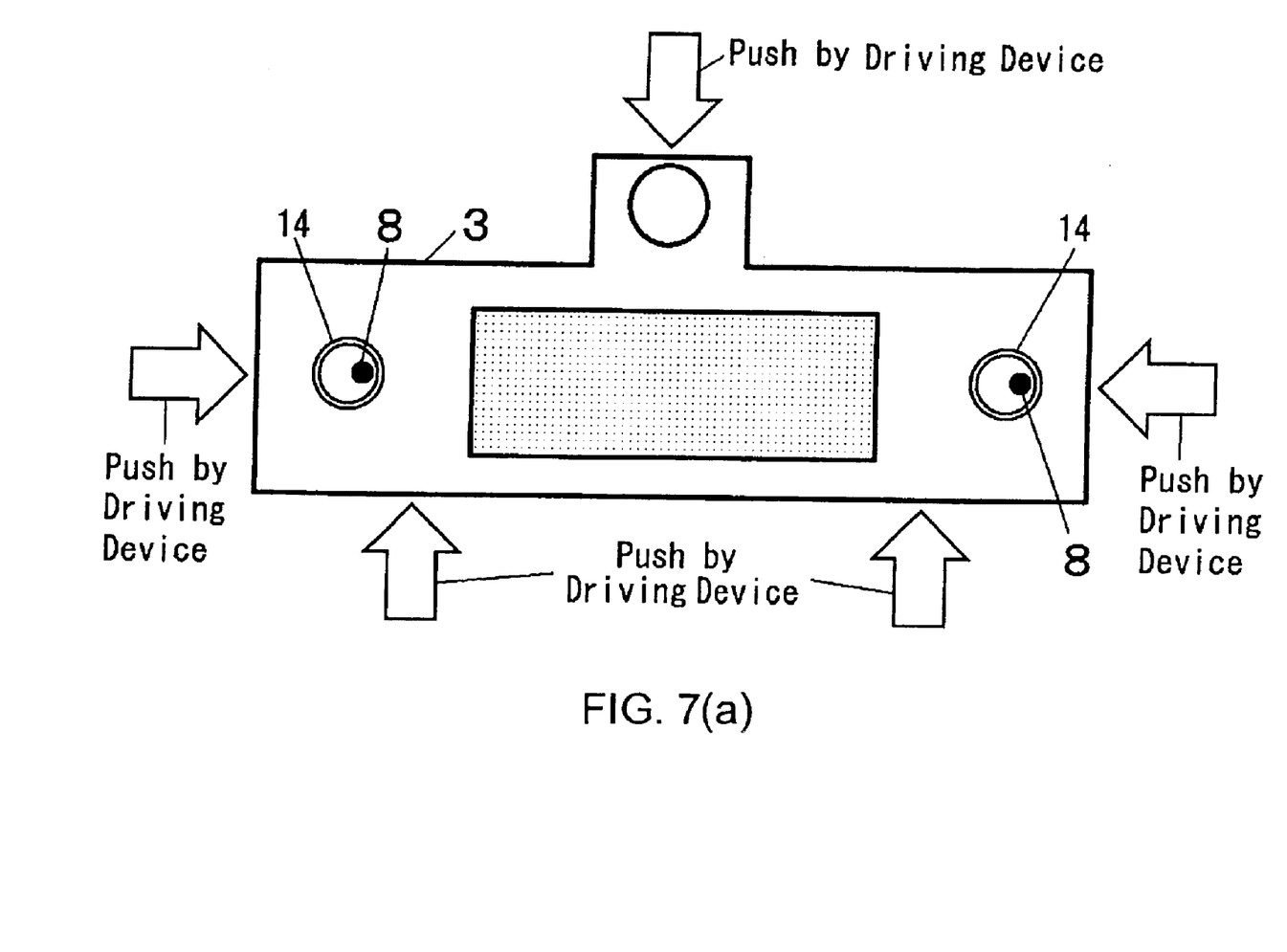
FIGS. 7(a), 7(b) and 7(c) show the plan view of the rotary guide plate of the probe card and the illustrative figure of rotation.
Figure 7B:
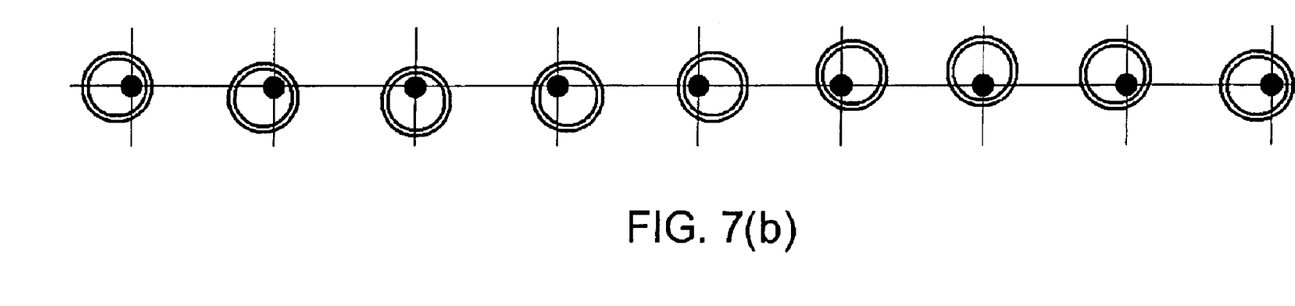
Figure 7C:
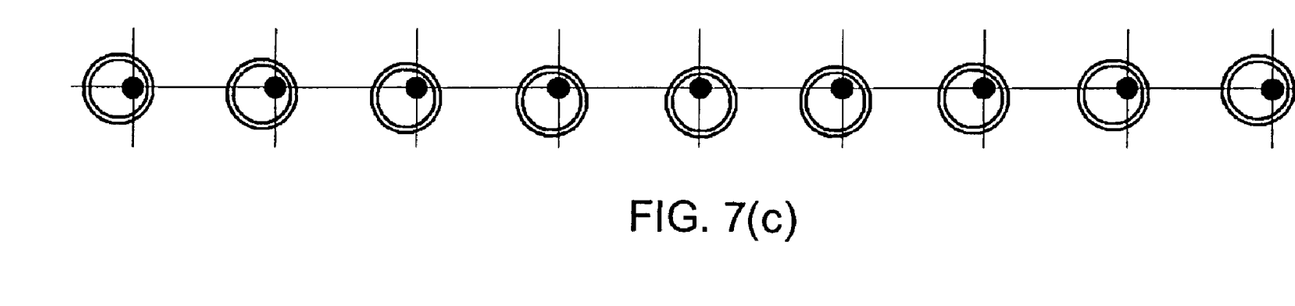

FIG. 6(a) is the disassembled oblique view of probe card of the second embodiment of this invention. The FIG. 6(b) is the cross section of eccentric bearing 14. In FIG. 6, eccentric bearing 14 is the bearing to guide the rotary guide plate to rotate in the plane. The fixed guide pin 8 is the guide pin inserted to the eccentric bearing 14 to rotate the rotary guide plate in the plane, the pin being deviated from the center of the rotation of the bearing. The wiring circuit board 1, the upper guide plate 2, the rotary guide plate 3, the bottom guide plate 4, the probe needle 5, the driving device 6, the guide hole 12 are the same as the first embodiment. FIGS. 7(a), 7(b) and 7(c) show the plan view of the rotary guide plate of the probe card and the illustrative figure of rotation.

The working of the probe card in the second embodiment of this invention as composed above is explained. The fundamental working of the probe card shown in FIG. 6(a) is the same as the first embodiment. The fixed guide pin 8 is inserted into the eccentric bearing 14 in the rotary guide plate 3. In this way, the rotary guide plate 3 is held enabling to move in the position where the center of the probe needle 5 becomes bent. The tip of the conductive straight probe needle 5 is moved to contact with the device under test. The driving device 6 moves the rotary guide plate 3 in the horizontal plane.

As shown in FIG. 6(b), the eccentric bearing 14 is made to insert the fixed guide pin 8 into the hole deviated from the center of the usual bearing such as a ball bearing or a roller bearing. The eccentric bearing 14 may be composed of the simple frictional bearing. The outside diameter of the eccentric bearing 14 is 1 mm, for example. The distance between the rotation center of the eccentric bearing 14 and the axis of the fixed guide pin 8 are 0.8 mm, for example. The eccentric bearing 14 is set up in the rotary guide plate 3, and the fixed guide pin 8 is inserted into the eccentric bearing 14. Both ends of the fixed guide pin 8 are fixed on the upper guide plate 2 and the bottom guide plate 4 respectively.

The method to rotate the probe needle 5 with the rotary guide plate 3 is explained with referring to FIGS. 7(a)–7(c). The driving device 6 pushes the rotary guide plate 3 in the bottom direction of FIG. 7(a), and the rotary guide plate 3 rotates around the fixed guide pin 8 inserted in the eccentric bearing 14, then the rotary guide plate 3 moves in the bottom direction of FIG. 7(a). The eccentric bearing 14 rotates around the fixed guide pin 8, and also the rotary guide plate 3 moves along an arc, then the probe needle 5 rotates. The driving device 6 pushes the rotary guide plate 3 in all the directions in order. Then, as shown in FIG. 7(b), the rotary guide plate 3 rotates at 360 degrees. And, the driving device 6 pushes the rotary guide plate 3 in the specific angle, then, as shown in FIG. 7(c), the rotary guide plate 3 swings in the angle of about 90 degrees.

As explained above, in the second embodiment of the present invention, the probe card is comprised as follows. The straight probe needle is inserted through the upper guide plate, the rotary guide plate and the lower guide plate, the center of probe needle is bent by displacing the rotary guide plate in the horizontal direction and the probe needle is rotated by rotating the rotary guide plate around the fixed guide pin inserted in the offset bearing in the rotary guide plate. Therefore, the probe needle can rotate smoothly.

The third embodiment of the present invention is the probe card, wherein the straight probe needle is inserted through the upper guide plate, the rotary guide plate and the lower guide plate, the center of probe needle is bent by displacing the rotary guide plate in the horizontal direction and the probe needle is rotated by rotating the rotary guide plate around the fixed guide pin fixed in the rotary guide plate and inserted in the eccentric bearing in the upper and lower guide plates.

Figures 8A, 8B:
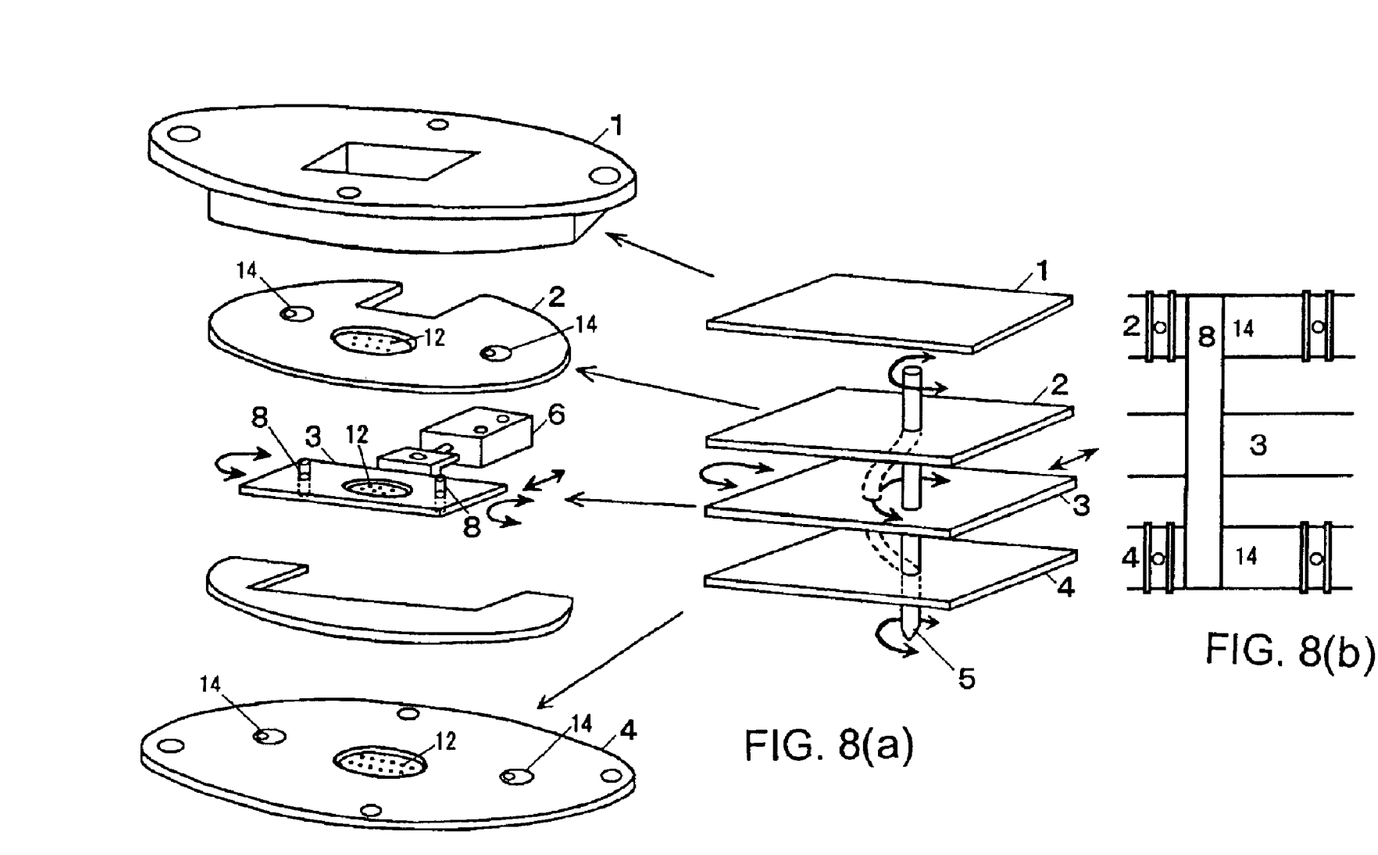
FIG. 8(a) is the disassembled oblique view of probe card of the third embodiment of this invention.
FIG. 8(b) is the cross section of eccentric bearing.

FIG. 8(a) is the disassembled oblique view of probe card of the third embodiment of this invention. The FIG. 8(b) is the cross section of eccentric bearing 14. In FIG. 8, eccentric bearing 14 is the bearing to guide the rotary guide plate to rotate in the plane. The fixed guide pin 8 is the guide pin fixed in the rotary guide pin and inserted in the eccentric bearing 14 to rotate the rotary guide plate in the plane, the pin being deviated from the center of the rotation of the bearing. The wiring circuit board 1, the upper guide plate 2, the rotation guide plate 3, the bottom guide plate 4, the probe needle 5, the drive device 6, the guide hole 12 are the same as the first embodiment.

The working of the probe card in the third embodiment of this invention as composed above is explained. The fundamental working of the probe card shown in FIG. 8(a) is the same as the first embodiment. The fixed guide pin 8 is inserted into the eccentric bearing 14 in the upper and lower guide plates 2, 4 and fixed in the rotary guide plate 3. In this way, the rotary guide plate 3 is held enabling to move in the position where the center of the probe needle 5 becomes bent. The tip of the conductive straight probe needle 5 is moved to contact with the device under test. The driving device 6 moves the rotary guide plate 3 in the horizontal plane.

The method to rotate the probe needle 5 with the rotary guide plate 3 is about the same as the second embodiment. The driving device 6 pushes the rotary guide plate 3, and the fixed guide pin 8 fixed on the rotary guide plate 3 moves. Due to the rotation of the eccentric bearing 14 in the upper guide plate 2 and the bottom guide plate 4, the fixed guide pin 8 moves along an arc. The rotary guide plate 3 moves along the arc. Then, the probe needle rotates.

As explained above, in the third embodiment of the present invention, the probe card is comprised as follows. The straight probe needle is inserted through the upper guide plate, the rotary guide plate and the lower guide plate, the center of probe needle is bent by displacing the rotating guide plate in the horizontal direction and the probe needle is rotated by rotating the rotary guide plate around the fixed guide pin fixed in the rotary guide plate and inserted in the eccentric bearing in the upper and lower guide plates. Therefore, the probe needle can rotate smoothly.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

What is claimed is:

1. A probe card of a measuring apparatus for a semiconductor device comprising:

an electrically-conductive linear probe needle whose bottom end contacts with the device under test, a circuit board with which the upper end of the probe needle is connected electrically, an upper guide plate held horizontally and firmly near the middle point between the upper end and the center of said probe needle and having a guide hole to guide said probe needle, a lower guide plate held horizontally and firmly near the middle point between the center and the bottom end of said probe needle and having a guide hole to guide said probe needle, a rotary guide plate held horizontally and movably near the center of said probe needle and having a guide hole to guide said probe needle, an initial-position holding means to hold said rotary guide plate temporary and firmly at the initial position where said probe needle is straight, a movable holding means to hold movably said rotary guide plate at the position where the center of said probe needle bent, a driving means to rotate said rotary guide plate in the horizontal plane, wherein an eccentric bearing is mounted in said rotary guide plate and said movable holding means is the fixed guide pin inserted in said eccentric bearing.

2. The probe card as claimed in claim 1, wherein eccentric bearings are mounted in both of said upper and lower guide plates and said movable holding means is the fixed guide pin fixed in said rotary guide plate and inserted in said eccentric bearings.

3. A probe card of a measuring apparatus for a semiconductor device comprising: an electrically-conductive linear probe needle whose bottom end contacts with the device under test, a circuit board with which the upper end of the probe needle is connected electrically, an upper guide plate held horizontally and firmly near the middle point between the upper end and the center of said probe needle and having a guide hole to guide said probe needle, a lower guide plate held horizontally and firmly near the middle point between the center and the bottom end of said probe needle and having a guide hole to guide said probe needle, a rotary guide plate held horizontally and movably near the center of said probe needle and having a guide hole to guide said probe needle, an initial-position holding means to hold said rotary guide plate temporary and firmly at the initial position where said probe needle is straight, a movable holding means to hold movably said rotary guide plate at the position where the center of said probe needle bent, a driving means to move said rotary guide plate in the horizontal plane, wherein an arc-shaped guide slot is made in said rotary guide plate and said movable holding means is a fixed guide pin to be inserted in said guide hole.

4. A probe card of a measuring apparatus for a semiconductor device comprising: an electrically-conductive linear probe needle whose bottom end contacts with the device under test, a circuit board with which the upper end of the probe needle is connected electrically, an upper guide plate held horizontally and firmly near the middle point between the upper end and the center of said probe needle and having a guide hole to guide said probe needle, a lower guide plate held horizontally and firmly near the middle point between the center and the bottom end of said probe needle and having a guide hole to guide said probe needle, a rotary guide plate held horizontally and movably near the center of said probe needle and having a guide hole to guide said probe needle, an initial-position holding means to hold said rotary guide plate temporary and firmly at the initial position where said probe, needle is straight, a movable holding means to hold movably said rotary guide plate at the position where the center of said probe needle bent, a driving means to move said rotary guide plate in the horizontal plane, wherein said rotary guide plate has a stepped stage to bend said probe needle at a first location along its length and to bend a second probe needle at a second location along its length.

* * * * *